(12) United States Patent
Ren et al.

(10) Patent No.: US 9,220,174 B2
(45) Date of Patent: Dec. 22, 2015

(54) PEDESTAL FOR FLAT PANEL DISPLAY DEVICE AND FLAT PANEL DISPLAY DEVICE

(71) Applicant: BOE Technology Group Co., Ltd., Beijing (CN)

(72) Inventors: Yan Ren, Beijing (CN); Zifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 27 days.

(21) Appl. No.: 14/445,178

(22) Filed: Jul. 29, 2014

(65) Prior Publication Data

US 2015/0313030 A1    Oct. 29, 2015

(30) Foreign Application Priority Data

Apr. 29, 2014    (CN) .......................... 2014 1 0178789

(51) Int. Cl.
| | | |
|---|---|---|
| *H05K 7/20* | (2006.01) | |
| *H05K 5/02* | (2006.01) | |
| *H05K 5/00* | (2006.01) | |

(52) U.S. Cl.
   CPC ............ *H05K 5/0234* (2013.01); *H05K 5/0017* (2013.01)

(58) Field of Classification Search
   CPC . H05K 5/0004; H05K 5/0017; H05K 5/0043; H05K 5/0047; H05K 5/0052; H05K 7/14
   USPC .................................................... 361/679.21
   See application file for complete search history.

(56) References Cited

U.S. PATENT DOCUMENTS

| | | | | |
|---|---|---|---|---|
| 7,102,592 B2 * | 9/2006 | Huang | ................... | G09G 5/006 345/1.1 |
| 7,855,703 B1 * | 12/2010 | Kang | ................ | G02F 1/133308 345/87 |
| 2004/0263423 A1 * | 12/2004 | Huang | ................... | G09G 5/006 345/1.1 |
| 2005/0185801 A1 * | 8/2005 | McCarty | ................. | H04N 5/64 381/87 |
| 2006/0203481 A1 * | 9/2006 | Kim | ........................ | H04N 5/64 362/227 |
| 2009/0180041 A1 * | 7/2009 | Wang | ....................... | H04N 5/64 348/836 |
| 2011/0304715 A1 * | 12/2011 | Yamada | ............ | G02B 27/2264 348/54 |
| 2013/0329162 A1 * | 12/2013 | Fujii | ........................ | H05K 7/14 349/58 |
| 2014/0313424 A1 * | 10/2014 | Imajo | ................... | G02B 6/0011 348/790 |
| 2015/0156446 A1 * | 6/2015 | Chikazawa | ............. | H04N 5/64 348/725 |
| 2015/0289390 A1 * | 10/2015 | Choi | ................... | H05K 5/0017 362/97.1 |

* cited by examiner

*Primary Examiner* — Anthony Q Edwards
(74) *Attorney, Agent, or Firm* — Westman, Champlin & Koehler, P.A.

(57) ABSTRACT

The present disclosure relates to a pedestal for a flat panel display device. The pedestal comprises: a supporting frame, comprising a horizontally arranged base plate and a framework vertically fixed on the base plate, the framework having a supporting plate on its top, and the supporting plate being configured to support an underside of a display panel of the flat panel display device; at least one circuit board, vertically disposed on the framework; a front shell and a rear shell, fixedly connected with the framework, and wherein the front shell and the rear shell have strip-type notches on their tops respectively, opening directions of the strip-type notches facing to each other and configured to horizontally limit a position of the display panel. An embodiment of the present invention further discloses a flat panel display device including such pedestal.

18 Claims, 5 Drawing Sheets

PEDESTAL FOR FLAT PANEL DISPLAY DEVICE AND FLAT PANEL DISPLAY DEVICE

CROSS-REFERENCE TO RELATED APPLICATION

This application claims the benefit of Chinese Patent Application No. 201410178789.x filed on Apr. 29, 2014 in the State Intellectual Property Office of China, the whole disclosure of which is incorporated herein by reference.

BACKGROUND OF THE INVENTION

1. Field of the Invention

The present disclosure relates to a technical field of display, more particularly, to a pedestal for a flat panel display device and a flat panel display device using the same.

2. Description of the Related Art

Recently, people pay more and more attention to large size (for example, 50 inch, 55 inch, or the like) flat panel TV products. Large screen has become a major trend in the future TV industrial development. Further, the large size flat panel TV also becomes preferred nowadays, when consumers purchase TVs.

As external dimensions of the flat panel TVs increase continuously, the display devices per se also become heavy. The flat panel display device generally includes a display panel and a pedestal. The pedestal is arranged horizontally and is used to support the display panel, while a circuit board of the flat panel display device is disposed within the pedestal.

In order to support the display panel stably, the pedestal is typically designed to have a larger width dimension. However, this has a negative influence on the overall visual effect of the flat panel display device, and thus such flat panel display device cannot further cater to aesthetic pursuance of the users.

SUMMARY OF THE INVENTION

In order to eliminate the above or other technical problems in the prior art, the present disclosure provides a pedestal for a flat panel display device and a flat panel display device using the same, so as to further improve the overall visual effect of the flat panel display device.

In accordance with one aspect of the present invention, it provides a pedestal for a flat panel display device, comprising:
  a supporting frame, comprising a horizontally arranged base plate and a framework vertically fixed on the base plate, the framework having a supporting plate on its top, and the supporting plate being configured to support an underside of a display panel of the flat panel display device;
  at least one circuit board, vertically disposed on the framework;
  a front shell and a rear shell, respectively fixedly connected with the framework, and
wherein the front shell and the rear shell have strip-type notches on their tops respectively, opening directions of the strip-type notches facing to each other and configured to horizontally limit a position of the display panel.

In accordance with another aspect of the present invention, it provides a flat panel display device, comprising a display panel and a pedestal as described above, wherein the display panel is seated on the supporting plate of the framework and is horizontally limited within the two strip-type notches on tops of the front and rear shells.

BRIEF DESCRIPTION OF THE DRAWINGS

The above and other features of the present invention will become more apparent by describing in detail exemplary embodiments thereof with reference to the accompanying drawings, in which.

EXPLANATIONS OF REFERENCE NUMBERS

1—base plate
2—framework
2a—framework body
3—supporting plate
4—display panel
5—front shell
6—rear shell
7—strip-type notch
8—first bending plate
9—second bending plate
10—third bending plate
11—printed circuit board of display panel
12—location hole
13—location protrusion
14—bending unit
15—protective pad
16—chip on film
17—bending clamp holes
18—first buckle
19—second buckle
20—bulge
21—raised limiting structure
22—convex edge
23—first elastic locating block
24—second elastic locating block
25—strip-type slot
26—insertion slot
27—speaker
28—speaker locating groove
29—sound transmission hole
30—driver circuit board
31—power supply circuit board
32—system circuit board
33—convex cover 34—exposure hole
35—recessed portion
36—power supply button
37—interface

DETAILED DESCRIPTION OF PREFERRED EMBODIMENTS OF THE INVENTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In order to further improve overall visual effect of flat panel display devices, an embodiment of the present invention provides a pedestal for a flat panel display device and a flat panel display device using the same. In a technical solution of the present embodiment, a supporting frame of the pedestal includes a horizontally arranged base plate and a framework vertically fixed onto the base plate. Respective circuit boards, a front shell and a rear shell are fixedly connected with the framework. The pedestal is arranged vertically on the whole or generally. In this way, the pedestal has a largely reduced width dimension, so that the flat panel display device has a better overall visual effect. In addition, the assembling of the pedestal having such structure is very simple, the assembling accuracy thereof is very high, and gravity center of the display device is lowered. Further, stability of the overall structure of the display device is improved, that is, the pedestal provides a better supporting stability for the display panel. In order to enable objectives, technical solutions and advantages of the present invention to become apparent, the present invention is described in detail by taking the following embodiments as examples.

Figure 1:
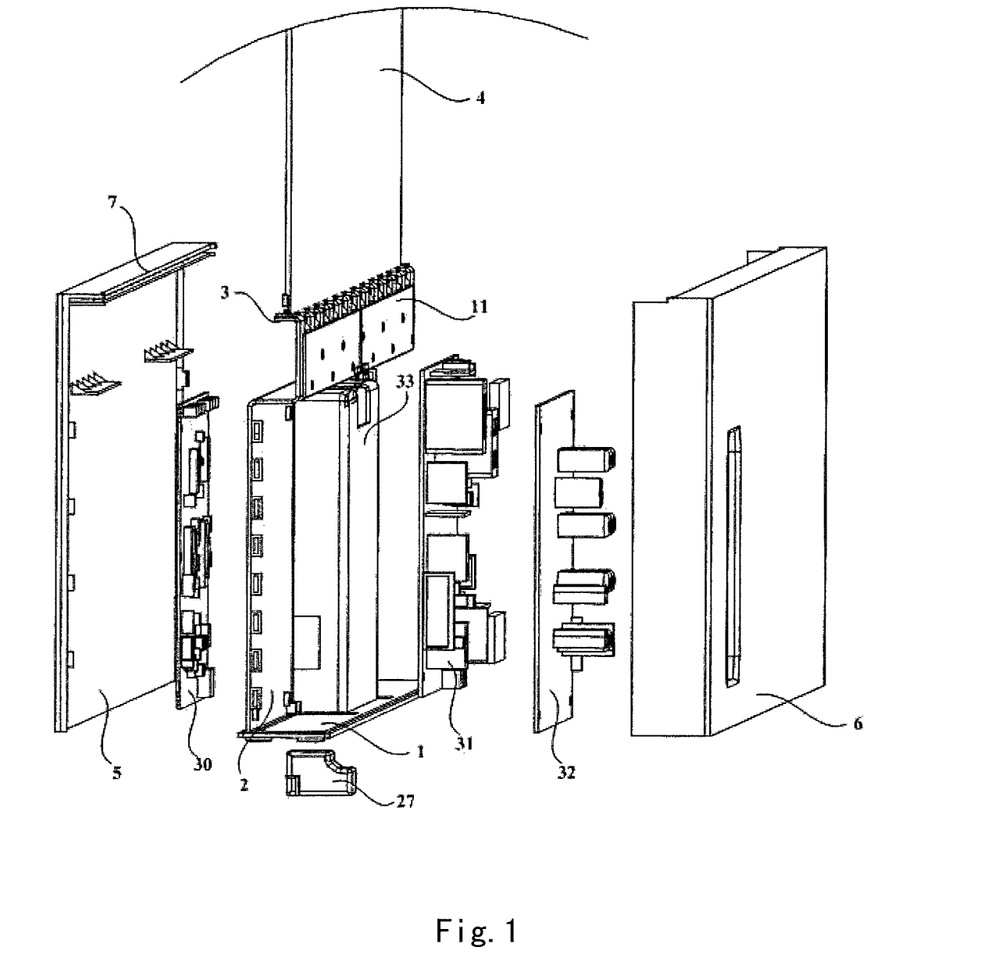
FIG. 1 is a schematic exploded view showing a structure of a flat panel display device in accordance with an embodiment of the present invention.

As shown in FIG. 1, the pedestal for the flat panel display device in accordance with the embodiment of the present invention includes:

a supporting frame, including a horizontally arranged base plate 1 and a framework 2 vertically fixed onto the base plate 1, wherein the framework 2 is provided with a supporting plate 3 on its top, and the supporting plate 3 is used to support an underside of a display panel 4 of the flat panel display device or support it from below;

at least one circuit board (in the present embodiment, including a driver circuit board 30, a power supply circuit board 31, and a system circuit board 32), each of which is vertically arranged and is fixedly connected with the framework 2;

a front shell 5 and a rear shell 6, fixedly connected with the framework 2 (in the present embodiment, snap-engaged with two vertical sides of the framework 2 respectively), wherein the front and rear shells 5 and 6 are provided with strip-type notches 7 on their tops, and opening directions of the two strip-type notches 7 are faced to each other and they are used to limit a horizontal position of the display panel 4.

In embodiments of the present invention, a term "front" means a side of the display device usually facing the user, and a term "rear" is opposite to the front, i.e., the rear side is opposite to the front side. The specific types of the flat panel display devices are not limiting to this, and for instance can be OLED (organic light-emitting diode) flat panel television, TFT-LED (Thin Film Transistor-Liquid Crystal Display) flat panel television, LED (Light-Emitting Diode) flat panel television or the like. The specific sizes of the flat panel televisions are not limited, for example, middle size or large size. In particular, the display panel of the OLED flat panel television is a hardened glass display panel, the thickness of which is thinner and has a better visual effect.

In one embodiment of the present invention, the front shell 5 and the rear shell 6 can be made of plastics or carbon fibers. The base plate 1 and the framework 2 are made of steel plates, which are fixed together by welding. In this way, they have a relatively good strength, enable the gravity center of the display device to move down, and further improve the stability of the entire structure of the display device. The shape of the framework 2 is not limited, and can be typically rectangular, the length of which can be designed depending on the length of the display panel 4.

In the technical solution of the present invention, respective circuit boards, the front shell 5, the rear shell 6 and the framework 2 are fixedly connected together, and the pedestal is arranged vertically on a whole. In this way, the width dimension of the pedestal is decreased largely. This improves the overall visual effect of the flat panel display device. In addition, the assembling of the pedestal with such structure is very simple, and the assembling accuracy thereof is very high. Moreover, this can enable the gravity center of the display device to move down and improve the stability of the entire structure of the display device.

Figure 2:
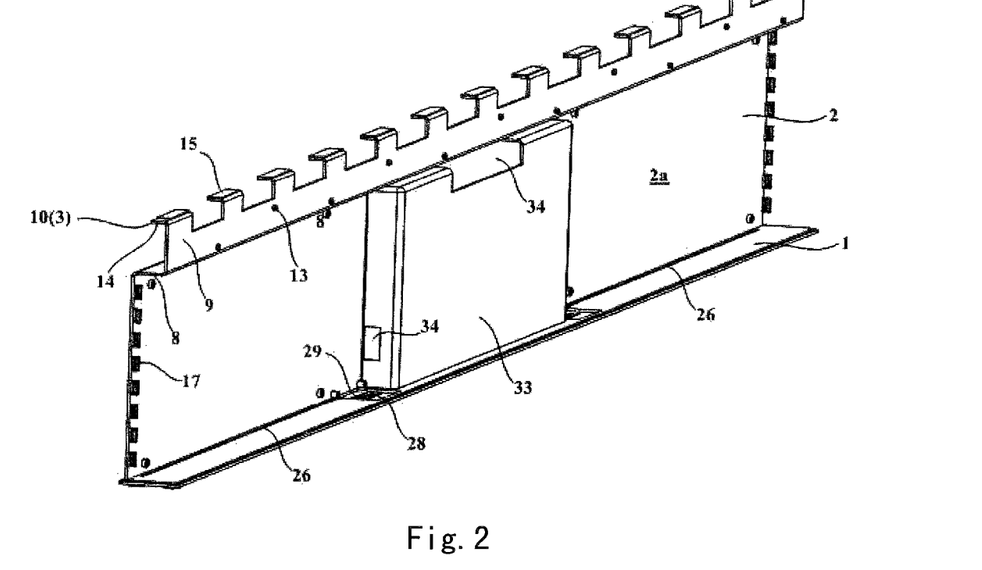
FIG. 2 is a schematic view showing a structure of a supporting frame.

As shown in FIG. 2, the framework 2 of the pedestal has a first bending plate 8 which is horizontally bent relative to a framework body 2a, a second bending plate 9 which is upwardly bent relative to the first bending plate 8, and a third bending plate 10 which is horizontally bent toward the framework body 2a relative to the second bending plate 9. In fact, a supporting plate 3 is the third bending plate 10. Specifically, the first bending plate 8 not only can be bent toward the front side with respect to the framework body 2a (in this case, the second bending plate 9 and the third bending plate 10 are accordingly located at the front side of the framework body 2a), but also can be bent toward the rear side with respect to the framework body 2a (in this case, the second bending plate 9 and the third bending plate 10 are accordingly located at the rear side of the framework body 2a).

The framework body 2a can be used to secure the circuit board. This is not only capable of improving the strength of the framework 2, but also is beneficial to optimize the interior space layout of the pedestal. Each circuit board is fixedly connected with the framework 2, and then the entire structure after such connection is very compact. The framework 2 can be manufactured by a stamping process for molding. In this way, its size accuracy is very good, the producing efficiency thereof is very high, and it is suited to produce in batch.

Figure 3:
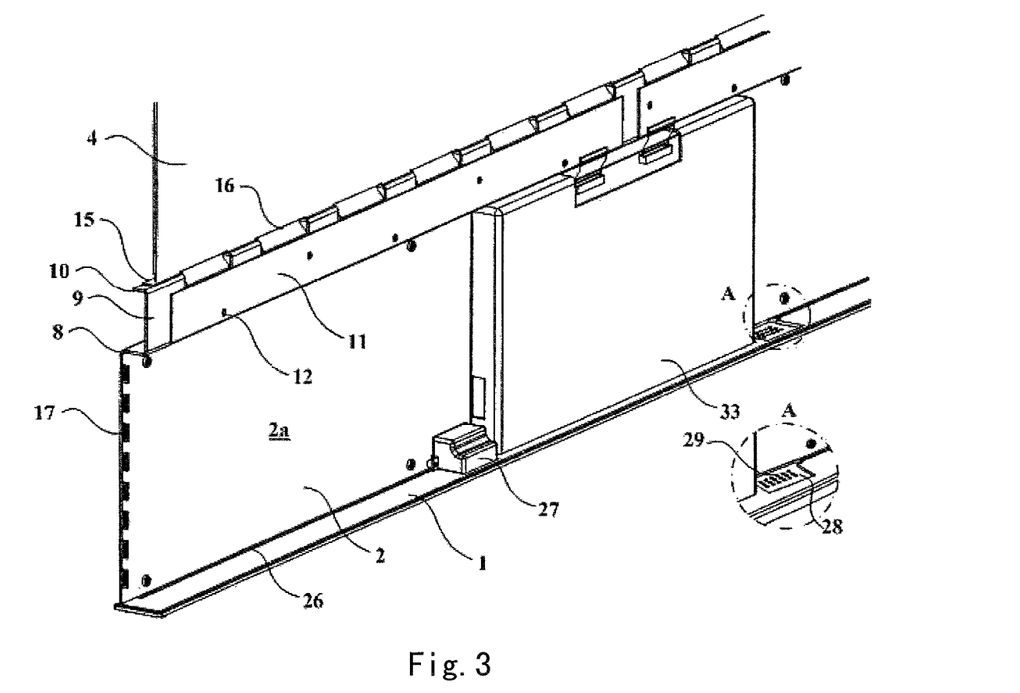
FIG. 3 is a schematic view showing a structure of the supporting frame, a display panel, a speaker and a driver circuit board assembled together, wherein it also shows an enlarged schematic view of a portion within a dashed circle A.

With reference to FIGS. 2 and 3, the second bending plate 9 has a plurality of location protrusions 13 which correspondingly cooperate with a plurality of location holes 12 on a printed circuit board 11 of the display panel. The third bending plate 10 includes a plurality of bending units 14 spaced apart from each other, and a supporting surface of each bending unit 14 is provided with a protective pad 15. Each COF (Chip on Film) 16 of the display panel 4 is positioned between two adjacent bending units 14.

The location protrusions 13 can be aligned with each other, i.e., arranged in one line or lines. Of course, the location protrusions 13 can be interlaced or arranged irregularly, so as to achieve a fool-proof effect. The location protrusions 13 are designed to facilitate locating and assembling of the printed circuit board 11 of the display panel with the framework 2. The printed circuit board 11 of the display panel can be fixedly connected with the second bending plate 9 with a fastener such as a screw, after the printed circuit board 11 is positioned relative to the second bending plate 9. The protective pad 15 is arranged on the supporting surface of the bending unit 14, so that it is possible to prevent scratching the display panel 4. The protect pad 15 can be silicone pads or rubber pads, and are attached to the supporting surface of the bending unit 14, for example by adhesives. A gap between two adjacent bending units 14 can be used to position the COF 16 of the display panel 4. In this way, the COFs 16 are not easy to be broken, bent or scratched and it is feasible to assemble and position them conveniently.

Figure 4:
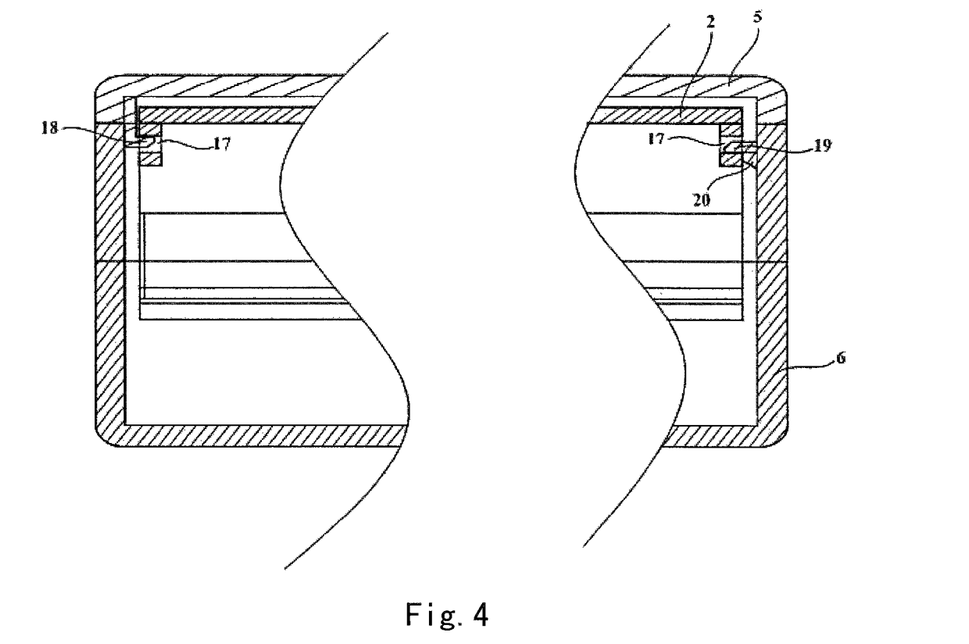
FIG. 4 is a horizontal cutaway view of a front shell, a rear shell and a framework assembled together.

In combination with FIGS. 2 and 4, the front shell 5 and the rear shell 6 are respectively cramped with two vertical sides of the framework 2. The two vertical sides of the framework 2 respectively have a set of bending clamp holes 17, and two vertical sides of the front shell 5 respectively have a set of first buckles 18. Further, two vertical sides of the rear shell 6 respectively have a set of second buckles 19, and the set of first buckles 18 and the set of second buckles 19 of the front shell 5 and the rear shell 6 which are disposed at the same side of the framework 2, are interlaced with each other and correspondingly snap-engaged with the set of bending clamp holes 17.

In this structure, the set of first buckles 18 and the set of second buckles 19 located on the same side can be interlaced, for example, the first buckles 18 of the front shell 5 are snap-engaged with odd number of the bending clamp holes 17 of the framework 2, while the second buckles 19 of the rear shell 6 are snap-engaged with even number of the bending clamp holes 17 of the framework 2. The clamping arrangement is shown in FIG. 4. The first buckles 18 of the front shell 5 are fitted to front faces of odd number of the bending clamp holes 17, leaving an assembly gap of 0.05 mm, and the second buckles 19 of the rear shell 6 are fitted to rear faces of even number of the bending clamp holes 17, leaving an assembly gap of 0.05 mm. In addition, the second buckle 19 of the rear shell 6 also has a bulge 20, which is engaged with a side end face of the bending clamp hole 17, leaving an assembly gap of 0.1 mm, so as to restrict relative displacement of the rear shell 6 and the framework 2 along a length direction of the display panel.

Figure 5:
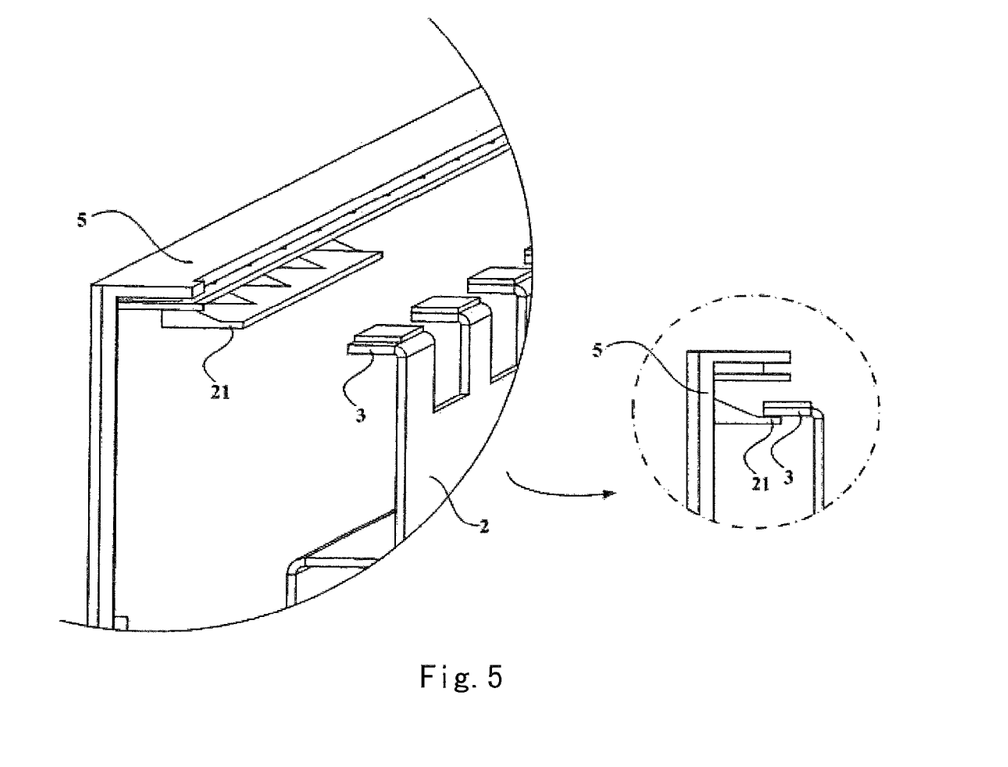
FIG. 5 is an assembling schematic view of a raised limiting structure and the framework.

With reference to FIG. 5, the front shell 5 has a raised limiting structure 21 which snaps into the underside of the supporting plate 3. The raised limiting structure 21 of the front shell 5 snaps into the underside of the supporting plate 3 and limits an upward freedom of the front shell 5. Strengthening ribs can be added onto the raised limiting structure 21, so as to enhance its strength.

Figure 6:
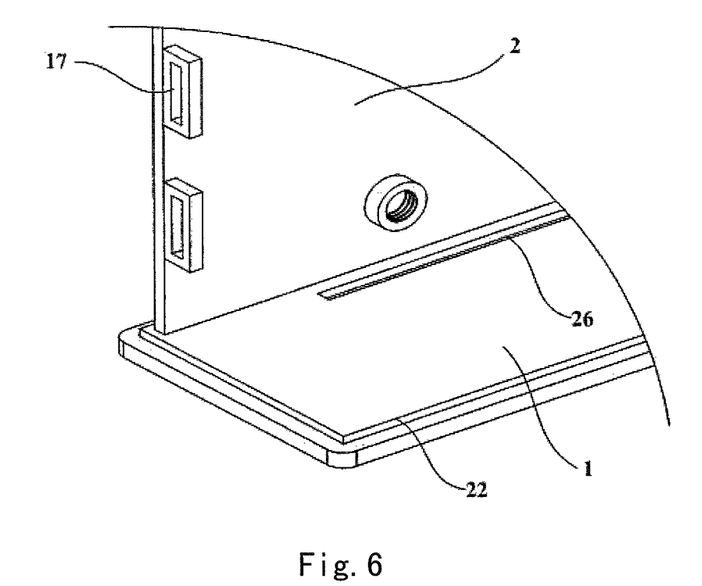
FIG. 6 is a schematic view showing a structure of a bottom of the supporting frame.

With reference to FIGS. 1 and 6, the base plate 1 has a convex edge 22 for limiting positions of the front shell 5 and the rear shell 6. The provision of the convex edge 22 can help to quickly and accurately position the front shell 5 and the rear shell 6 onto the supporting frame. The above structures make the assembly of the pedestal very convenient and make the assembly accuracy thereof very high.

Figure 7:
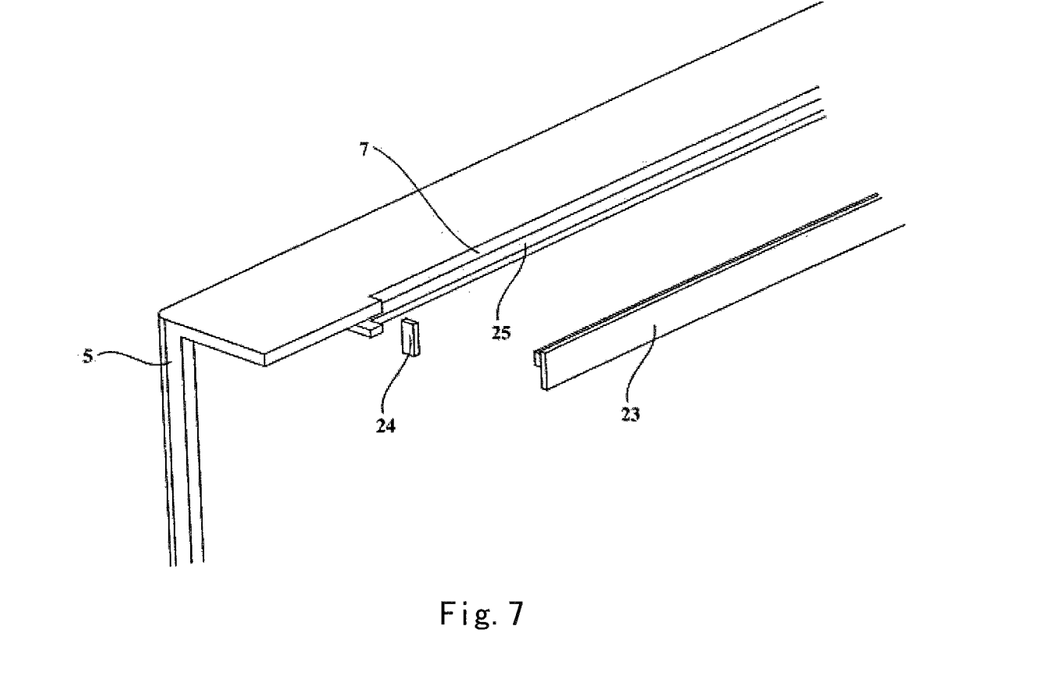
FIG. 7 is a schematic view showing a structure of a first elastic locating block and a second elastic locating block.
Figure 8:
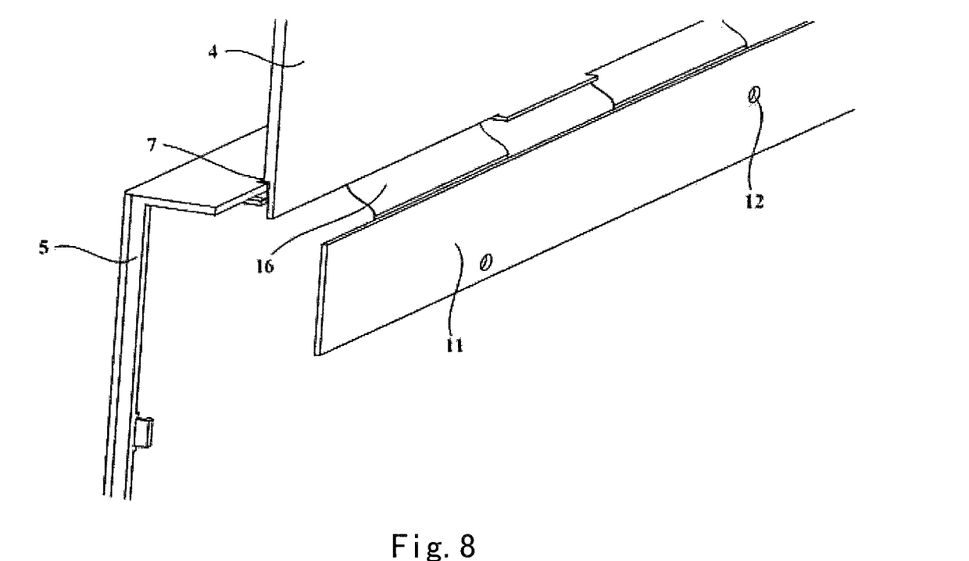
FIG. 8 is an assembling schematic view of the front shell and the display panel.

With reference to FIGS. 7 and 8, each strip notch 7 has a first elastic locating block 23 on a limiting face along a length direction of the display panel 4, and each strip notch 7 has a second elastic locating block 24 on a limiting face along a thickness direction of the display panel 4 (in this figure, the front shell 5 is taken as an example, and the rear shell 6 has a similar structure to the front shell). The elastic locating blocks can increase the friction coefficient and friction force between the limiting face and the display panel. After the display panel is assembled with the pedestal, the display panel cannot be easily pulled out from the pedestal, thereby further improve the reliability of the products.

Specifically, each strip notch 7 has a strip slot 25 extending along a length direction of the display panel 4, and the first elastic locating block 23 is a silicone block having a T-shaped section which is snapped into the strip slot 25. In order to enhance the strength of the strip slot 25, a plurality of strengthening ribs (not shown herein) can be disposed beneath each strip slot 25. The silicon block 25 having the T shaped section is in interference fit with the strip slot 25, thereby achieving simple assembly and firm fixation. The second elastic locating block 24 can also be a silicone block, which is attached to a limiting face of the strip notch 7 along a thickness direction of the display panel 4. The elastic locating block made of silicone materials has a relatively large friction coefficient, which can largely increase the friction force between the display panel and the pedestal, so that the display panel cannot be easily pulled out from the pedestal.

In combination with FIGS. 1, 2 and 6, the base plate 1 has an insertion slot or insertion slots 26 for accommodating the circuit board, corresponding to each of the circuit boards. Thus, each circuit board is inserted into the respective insertion slot 26 and fixedly connected with the framework 2 with a fastener. The framework 2 or the base plate 1 has at least one speaker locating groove 28, each of which is provided with a plurality of sound transmission holes 29. A speaker 27 is located within each speaker locating groove 28 and fixedly connected with the speaker locating groove 28 with a fastener. The insertion slot 26 is used to rapidly position and assemble the circuit board, and the speaker locating groove 28 is used to rapidly position and assemble the speaker 27. These designs largely increase the assembling efficiency of the pedestal. At least one speaker locating groove 28 can not only be located on the framework 2 to send out a sound at the front side or the back side of the display device, but also can be disposed on the base plate 1 so as to send out a sound at the bottom side of the display device, but this is not limited herein. The insertion slot 26 and the speaker locating groove 28 can be formed by a stamping process for molding of the framework 2, and thus the machining thereof is very convenient.

The specific number and type of the circuit boards in the pedestal can be chosen depending on the specific type of the display device. As shown in FIGS. 1-3, in the OLED flat panel TV, the at least one circuit board includes a driver circuit board 30, a power supply circuit board 31 and a system circuit board 32. In the present embodiment, after the assembling, the power supply circuit board 31 and the system circuit board 32 are located beneath the first bending plate 8; the framework 2 has a convex cover 33 protruding toward one side where the first bending plate 8 is located, and the driver circuit board 30 is located within the convex cover 33 after assembling. The convex cover 33 is provided with exposure holes 34, corresponding to each set of connectors of the driver circuit board 30. In the present embodiment, the power supply circuit board 31 and the system circuit board 32 are fixed on a back side of the framework 2, and the convex cover 33 is protruded toward the back side of the framework 2. Two connectors above the driver circuit board 30 are connected with the printed circuit board 11 of the display panel via cables, and connectors at two sides of a lower part of the driver circuit board 30 are respectively connected with the power supply circuit board 31 and the system circuit board 32 via cables (not shown herein).

It should be noted that if the first bending plate 8 is bent forwardly relative to the framework body 2a, the first bending plate 8, the second bending plate 9 and the third bending plate 10 all will be located at the front side of the framework body 2a. In this case, the power supply circuit board 31 and the system circuit board 32 are preferably fixed on the front side of the framework 2, and the convex cover 33 projects toward the front side of the framework 2. The convex cover 33 is used as a shield cover of the driver circuit board 30, which can largely reduce electromagnetic interference subjected by the driver circuit board 30. Therefore, this design can be helpful to improve working stability of the driver circuit board 30, thereby improving the working performance of the display device.

Figure 9:
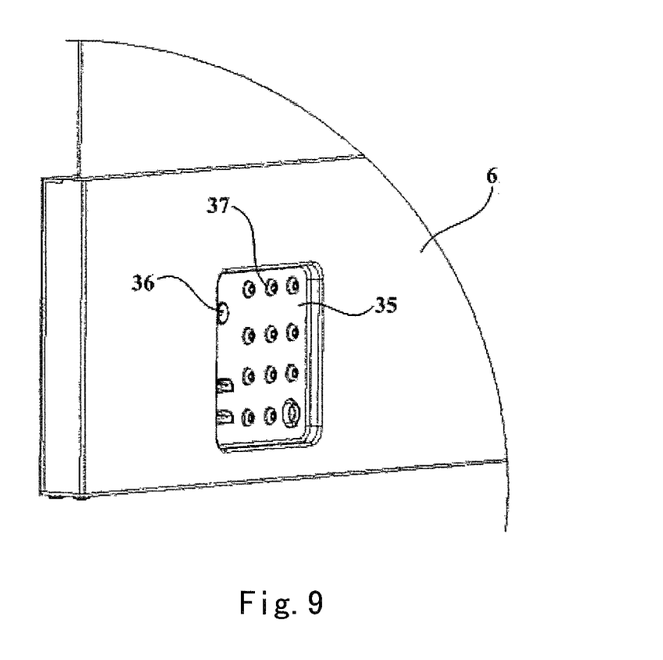
FIG. 9 is a schematic view of a structure showing a recessed portion of the rear shell.

As shown in FIG. 9, the rear shell 6 has a recessed portion 35, in which a power supply button 36 and at least one interface 37 are provided. The power supply button 36 and the interface 37 are hidden from the view, and they do not affect the entire thickness of the pedestal such that the overall appearance of the pedestal is relatively concise.

Another embodiment of the present invention also provides a flat panel display device, which, as shown in FIG. 1, includes a display panel 4 and a pedestal as described in any preceding technical solution. The display panel 4 is seated on the supporting plate 3 of the framework 2 and is horizontally limited within two strip notches 7 on tops of the front shell 5 and the rear shell 6. Such flat panel display device has a better overall visual effect, the gravity center of the flat panel display device is very low and the pedestal provides a better supporting stability for the display panel.

When assembling the display device, firstly respective circuit boards are fixed on the framework 2, and the speakers 27 are fixed within the corresponding speaker locating grooves 28. Then, the front shell 5 is snap-engaged with the framework 2, and the display panel 4 is placed onto the supporting plate 3 of the framework 2 Finally, the printed circuit board 11 of the display panel is fixed on the second bending plate 9, and the rear shell 6 is snap-engaged with the framework 2. Therefore, steps of the assembling process are simplified, the assembling error is minor, and the structure is stable and reliable.

Although several exemplary embodiments have been shown and described, the present invention is not limited to those and it would be appreciated by those skilled in the art that various changes or modifications may be made in these embodiments without departing from the principles and spirit of the disclosure. These changes or modifications also fall within the scope of the present invention. The scope of the present invention is defined by the claims and their equivalents.

What is claimed is:

1. A pedestal for a flat panel display device, the pedestal comprising:
   a supporting frame, comprising a horizontally arranged base plate and a framework vertically fixed on the base plate, the framework having a supporting plate on its top, and the supporting plate being configured to support an underside of a display panel of the flat panel display device;
   at least one circuit board, vertically disposed on the framework;
   a front shell and a rear shell, respectively fixed connected with the framework, and said front shell and rear shell have strip-type notches on their tops respectively, opening directions of the strip-type notches facing to each other and being configured to horizontally limit a position of the display panel.

2. The pedestal according to claim 1, wherein the framework has a first bending plate horizontally bent relative to a framework body, a second bending plate upwardly bent relative to the first bending plate and a third bending plate horizontally bent toward the framework body relative to the second bending plate, wherein said supporting plate is the third bending plate.

3. The pedestal according to claim 2, wherein said second bending plate has a plurality of location protrusions which correspondingly cooperate with a plurality of location holes on a printed circuit board of the display panel, wherein said location protrusions are aligned with each other, interlaced or arranged irregularly.

4. The pedestal according to claim 2, wherein said third bending plate comprises a plurality of bending units spaced apart, and wherein a supporting surface of each bending unit is provided with a protective pad, and each chip on film of said display panel is located between two adjacent bending units.

5. The pedestal according to claim 1, wherein said front shell and rear shell are snap-engaged with two vertical sides of said framework, the two vertical sides of said framework have a set of bending clamp holes respectively, wherein two vertical sides of said front shell have a set of first buckles respectively, two vertical sides of said rear shell have a set of second buckles respectively, and said set of first buckles of the front shell and said set of second buckles of the rear shell which are mounted on the same side of the framework are interlaced with each other and correspondingly snap-engaged with the set of bending clamp holes.

6. The pedestal according to claim 1, wherein said front shell has a raised limiting structure snapped into the underside of the supporting plate.

7. The pedestal according to claim 6, wherein the second buckle of the rear shell is provided with a bulge which is engaged with a side end face of the bending clamp hole.

8. The pedestal according to claim 1, wherein said base plate has a convex edge for limiting positions of said front shell and rear shell.

9. The pedestal according to claim 1, wherein each of said strip-type notches is provided with a first elastic locating block on a limiting face thereof along a length direction of the display panel.

10. The pedestal according to claim 1, wherein each of said strip-type notches is provided with a second elastic locating block on a limiting face thereof along a thickness direction of the display panel.

11. The pedestal according to claim 1, wherein each of said strip-type notches has a strip-type slot extending along a length direction of the display panel.

12. The pedestal according to claim 9, wherein each of said strip-type notches has a strip-type slot extending along a length direction of the display panel, and wherein the first elastic locating block is a silicone block having a T shaped section and snapped into the strip-type slot.

13. The pedestal according to claim 1, wherein said base plate has an insertion slot/insertion slots for accommodating the at least one circuit board, and each of said circuit board is inserted into the corresponding insertion slot and is fixedly connected with the framework by a fastener.

14. The pedestal according to claim 1, wherein said framework or said base plate has at least one speaker locating groove, each of which is provided with a plurality of sound transmission holes, and said speaker is located within each of said speaker locating groove and is fixedly connected with the at least one speaker locating groove by a fastener.

15. The pedestal according to claim 1, wherein said at least one circuit board is fixedly connected with the framework and comprises a driver circuit board, a power supply circuit board and a system circuit board,
   wherein said power supply circuit board and said system circuit board are located beneath said first bending plate, said framework has a convex cover protruding toward a side where the first bending plate is located, and said driver circuit board is located within said convex cover, which is provided with exposure holes corresponding to each set of connectors of the driver circuit board.

16. The pedestal according to claim 1, wherein said rear shell has a recessed portion, in which a power supply button and at least one interface are provided.

17. The pedestal according to claim 1, wherein said pedestal is vertically arranged on the whole.

18. A flat panel display device, wherein, comprising a display panel and a pedestal according to claim 1, wherein said display panel is seated on said supporting plate of the framework and is horizontally limited within the two strip-type notches on tops of said front and rear shells.

* * * * *